United States Patent
Fredericksen et al.

(10) Patent No.: US 9,089,047 B2
(45) Date of Patent: Jul. 21, 2015

(54) GROUNDED BELT AND MOVABLE DRAWER APPARATUS

(71) Applicant: International Business Machines Corporation, Armonk, NY (US)

(72) Inventors: Ross T. Fredericksen, Mantorville, MN (US); Don A. Gilliland, Rochester, MN (US); Dennis J. Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 14/032,778

(22) Filed: Sep. 20, 2013

(65) Prior Publication Data

US 2015/0085447 A1    Mar. 26, 2015

(51) Int. Cl.
| | |
|---|---|
| A47B 88/00 | (2006.01) |
| H05K 9/00 | (2006.01) |
| A47B 88/04 | (2006.01) |
| H05K 5/02 | (2006.01) |

(52) U.S. Cl.
CPC .............. *H05K 9/0067* (2013.01); *A47B 88/04* (2013.01); *H05K 5/0217* (2013.01); *A47B 2210/0089* (2013.01)

(58) Field of Classification Search
CPC ... H05K 9/0067; H05K 5/0217; A47B 88/04; A47B 2210/0089
See application file for complete search history.

(56) References Cited

U.S. PATENT DOCUMENTS

| | | | | |
|---|---|---|---|---|
| 5,319,880 | A * | 6/1994 | Kuhlman | 49/360 |
| 5,940,306 | A * | 8/1999 | Gardner et al. | 700/244 |
| 7,362,942 | B2 | 4/2008 | Beck | |
| 7,454,113 | B2 | 11/2008 | Barnes | |
| 7,817,894 | B2 | 10/2010 | Beck | |
| 7,825,617 | B2 * | 11/2010 | Huber | 318/466 |
| 7,899,297 | B2 | 3/2011 | Barnes | |
| 7,928,684 | B2 * | 4/2011 | Hauer | 318/646 |
| 8,060,162 | B2 | 11/2011 | Abdul-Gaffoor et al. | |
| 8,324,842 | B2 * | 12/2012 | Gasser | 318/14 |
| 2003/0221370 | A1 * | 12/2003 | Nakano | 49/332 |
| 2004/0100169 | A1 * | 5/2004 | Huber et al. | 312/319.5 |
| 2005/0074259 | A1 * | 4/2005 | Tachiki et al. | 399/121 |
| 2005/0097021 | A1 * | 5/2005 | Behr et al. | 705/36 |
| 2008/0115417 | A1 * | 5/2008 | Huber | 49/349 |
| 2008/0211365 | A1 * | 9/2008 | Moll et al. | 312/319.1 |
| 2012/0148300 | A1 * | 6/2012 | Katoh et al. | 399/121 |
| 2013/0286600 | A1 * | 10/2013 | Yu | 361/727 |

* cited by examiner

*Primary Examiner* — Hanh V Tran
(74) *Attorney, Agent, or Firm* — Nicholas D. Bowman; Robert Williams

(57) ABSTRACT

A grounded belt and drawer apparatus including a drawer, mounted on a first track, a tensioner body having a first pulley, a supporting member, and a first belt. The drawer moveable on a first line in a first direction and a second direction. The tensioner body mounted on a second track and moveable in the first direction and the second direction. The first belt having a first end and a second end, rounded over the first pulley, and a first segment and second segment extending distally from the first pulley in the first direction. The first belt conductively connected to the drawer and to a first fixed point which forms a conductive path from the drawer to the first fixed point.

20 Claims, 5 Drawing Sheets

GROUNDED BELT AND MOVABLE DRAWER APPARATUS

BACKGROUND

The present disclosure relates to the field of grounded drawers. More specifically, the present disclosure relates to rack drawers having a grounding belt grounding the drawer to a chassis.

In some instances, drawers may be grounded to reduce the instances of electric noise and electric discharge which may affect components, instruments, or other devices within a drawer. As the complexity, expense, and sensitivity of components, instruments, or other devices increases the need to provide a sufficiently grounded drawer which may decrease the occurrence of electronic noise and discharge similarly increases.

SUMMARY

The present disclosure is directed to a grounded belt and drawer apparatus. A grounded belt and drawer apparatus may include a drawer, mounted on a first track. The drawer may be moveable on a first line in a first direction and a second direction. The first and second directions may be opposite. The apparatus may also include a tensioner body having a first pulley. The tensioner body may be mounted on a second track and moveable on a second line in the first direction and the second direction and parallel to the first line. The apparatus may also include a first belt constructed from flexible conductive material. The first belt may have a first end and a second end, and the first belt may round over the first pulley. The first belt may have a first segment and second segment. The first segment and the second segment may extend distally from the first pulley in the first direction. The first end may be conductively connected to the drawer and the second end may be conductively connected to a first fixed point.

The apparatus may include a supporting member, attached to the tensioner body and to the drawer. The supporting member may apply force on the tensioner body in the second direction as the drawer operably moves in the second direction. The first belt may form a conductive path from the drawer to the first fixed point. The drawer may be moveable between a closed position and an open position. The first segment and the second segment may be positioned in a substantially close overlying relationship when the drawer is in the closed position.

The second track may be positioned at least partially enclosed in the first track. The first segment and the second segment may extend distally from the first pulley substantially in parallel. The grounded belt and drawer apparatus may further include a first deflection pulley, connected to the tensioner body. The first deflection pulley may deflect the first segment and the second segment into a substantially close overlying relationship.

The first belt may be at least partially covered in flexible non-conductive material. The supporting member may be a spring. The supporting member may be a cable and a pulley. The grounded belt and drawer apparatus may also include a chassis at least partially enclosing the drawer. The second end of the first belt may be conductively connected to the chassis and may form a conductive pathway from the drawer to the chassis. The flexible conductive material may include copper, steel, aluminum, silver, and gold.

A grounded belt and drawer apparatus may also include a second belt constructed from flexible conductive material and having a first end and a second end, the second belt rounding over the second pulley and having a first segment and a second segment extending distally from the second pulley in the second direction, the first end conductively connected to the drawer and the second end conductively connected to a second fixed point.

The first segment and the second segment of the first belt and the second belt may be positioned in a substantially close overlying relationship when the drawer is in the closed position. The first segment and the second segment of the second belt may extend distally from the second pulley substantially in parallel.

The grounded belt and drawer apparatus may also include a first deflection pulley and a second deflection pulley. The first and second deflection pulleys may be connected to the tensioner body. The first deflection pulley may deflect the first segment and the second segment of the first belt into a substantially close overlying relationship. The second deflection pulley may deflect the first segment and the second segment of the second belt into a substantially close overlying relationship. The second ends of the first belt and the second belt may form a conductive pathway from the drawer to the chassis.

DETAILED DESCRIPTION

Figure 1:
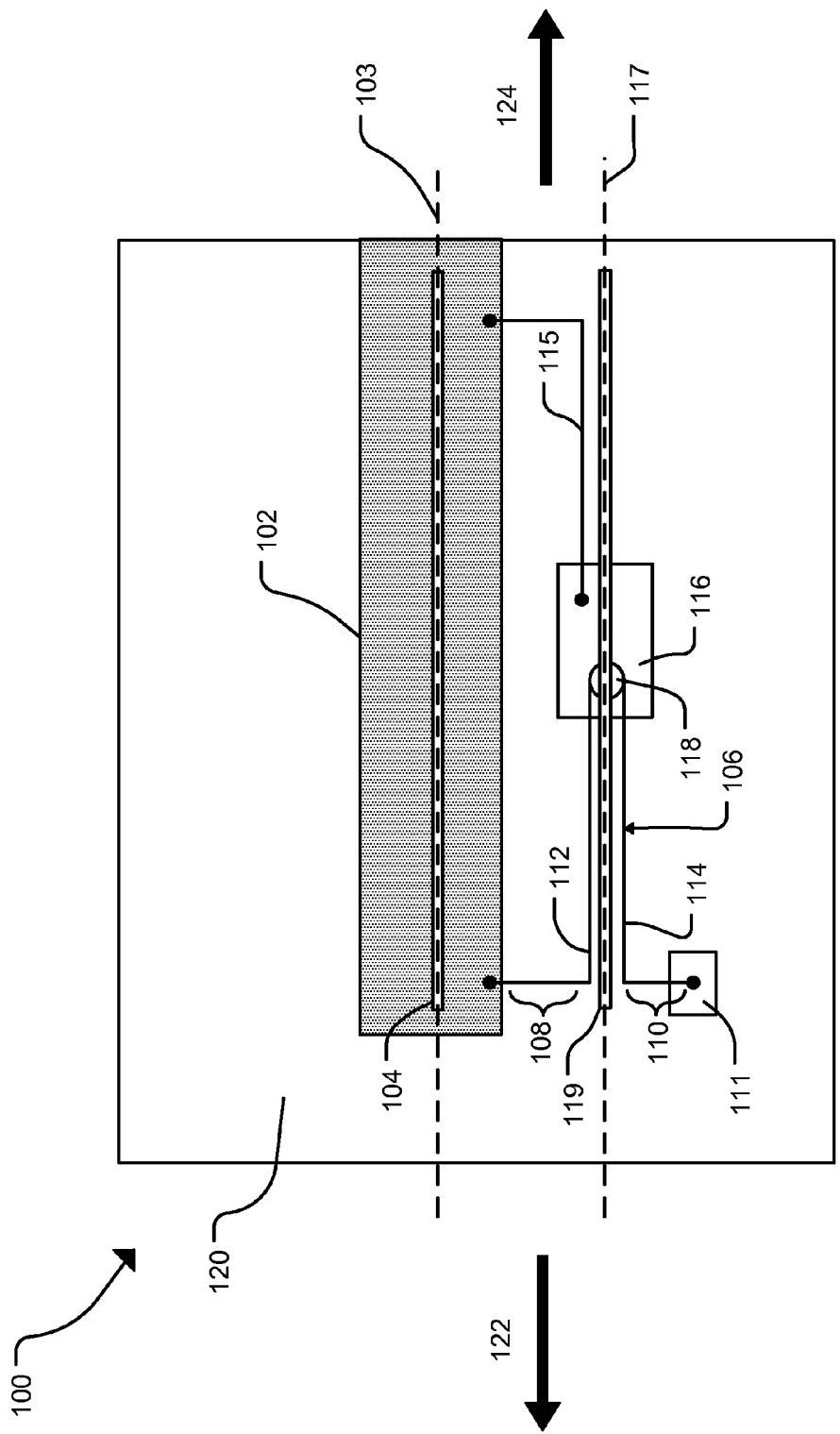
FIG. 1 is diagram of an embodiment of a grounded belt and drawer apparatus showing a drawer and a first belt positioned in a closed position.

In the following description, reference is made to the accompanying drawings which show by way of illustration various examples by which the disclosure may be used. Other examples of the disclosure may be used, as structural and operational changes may be made without departing from the scope of the present disclosure.

While the same nomenclature and same numbers may be used to identify elements throughout the disclosure, this practice is not intended to limit the scope of the disclosure. Identified elements in one figure may not be identical to other same named or identified elements in other figures.

The present disclosure, in some embodiments, relates to a grounded drawer apparatus. More specifically, the disclosure relates to a grounded drawer apparatus including at least a first belt, a tensioner body, a drawer, and a supporting member. The drawer may be mounted on a first track and may be moveable on a first line in a first direction and a second direction. The first and second directions may be opposite. The tensioner body may be mounted on a second track and may be movable on a second line in the first direction and the second direction. The first line and second line may be parallel. The tensioner body may also have a first pulley. The first belt may be constructed from a flexible conductive material and may have a first and a second end. The first belt may round over the first pulley and may extend distally from the first pulley in the first direction.

The first end may be conductively connected to the drawer and the second end may be conductively connected to a first fixed point. The supporting member may be attached to the tensioner body and to the drawer. The supporting member may apply force on the tensioner body in the second direction as the drawer operably moves in the second direction. In some embodiments, a second belt may also be used as the supporting member.

In some instances, drawer apparatuses may be mounted in a track and may be movable between an open position and a closed position. The track may employ ball bearings, slides or other types of tracks which may allow the drawer to be movable in the track. The track may employ elements, for example ball bearings, which may create make before break (MBB) or break before make (BBM) contacts. MMB and BBM contacts may generate electrostatic noise or electrostatic discharge as the drawer is moved along the track. Other types of tracks may also be employed, including slides, which may generate impulses of electromagnetic noise or electrostatic discharge from friction of the slide as the drawer is moved between the open position and the closed position. Electromagnetic noise or discharge may cause erroneous signal readings from instruments placed in the drawer, may damage electronic instruments placed within the drawer, and may generate discharges which may ignite flammable matter in the area of the drawer. Accordingly, the use of grounding elements to ground the drawer may reduce electronic noise or discharges generated by moving the drawer in the track.

Referring now to FIG. 1, an embodiment of a grounded drawer and belt assembly 100 can be seen including a drawer 102, a first reference line 103, a first track 104, a first belt 106 having a first end 108, a second end 110, a first fixed point 111, a first segment 112, and a second segment 114, a supporting member 115, a tensioner body 116, a second reference line 117, having a first pulley 118, a second track 119 and a chassis 120.

The drawer 102 may provide a bay in which objects, such as electronics or instruments for example, may be positioned. The drawer 102 may be constructed partially or completely from conductive materials including metal or other conductive materials which allow the drawer 102 to be grounded. The drawer 102 may be mounted on a first track 104 and may be moveable on a first reference line 103 in a first direction 122 and a second direction 124. The first direction 122 and the second direction 124 may be opposite from one another.

Figure 2:
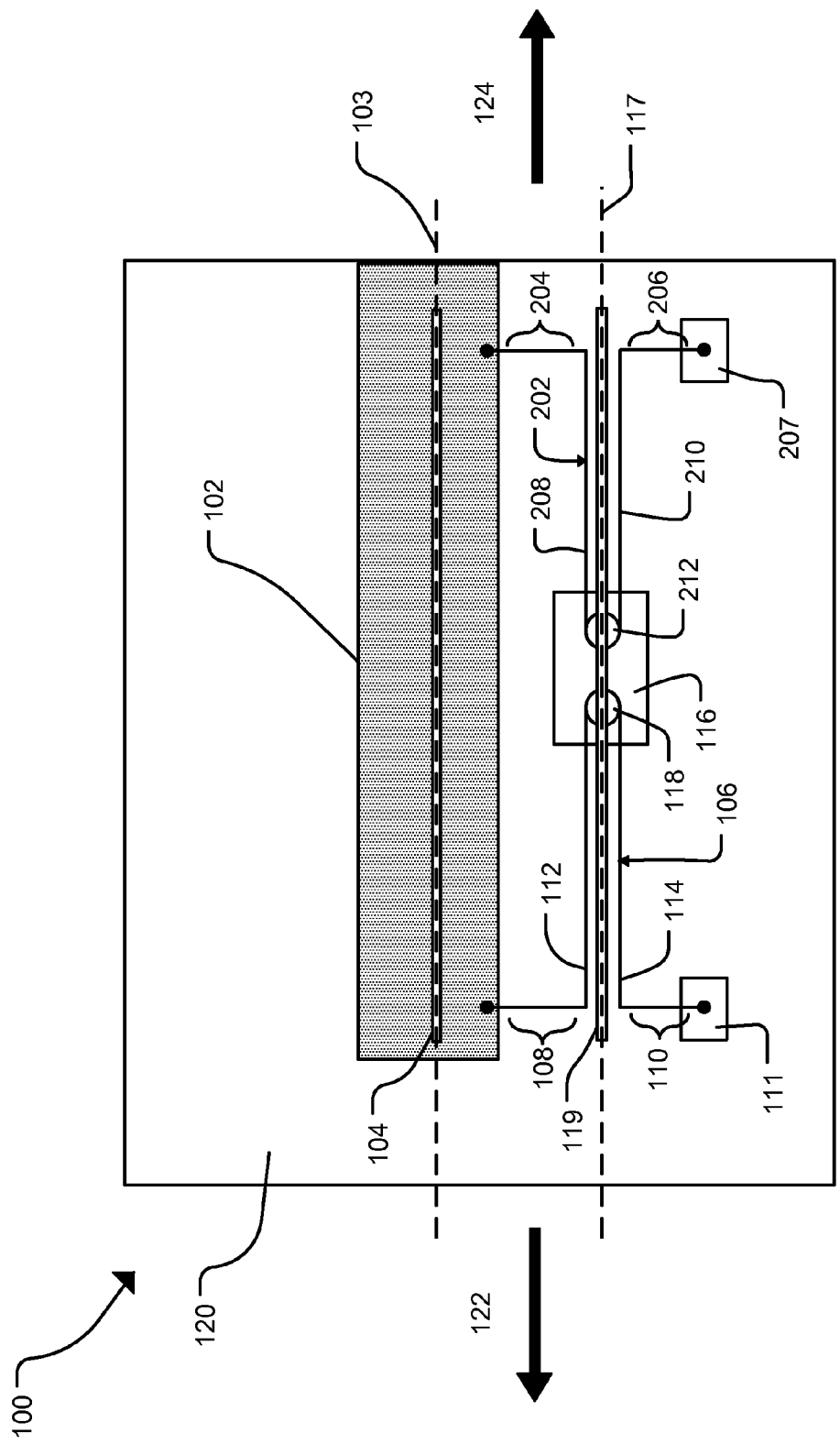
FIG. 2 is diagram of an embodiment of a grounded belt and drawer apparatus showing a drawer and a first belt and second belt positioned in a closed position.
Figure 3:
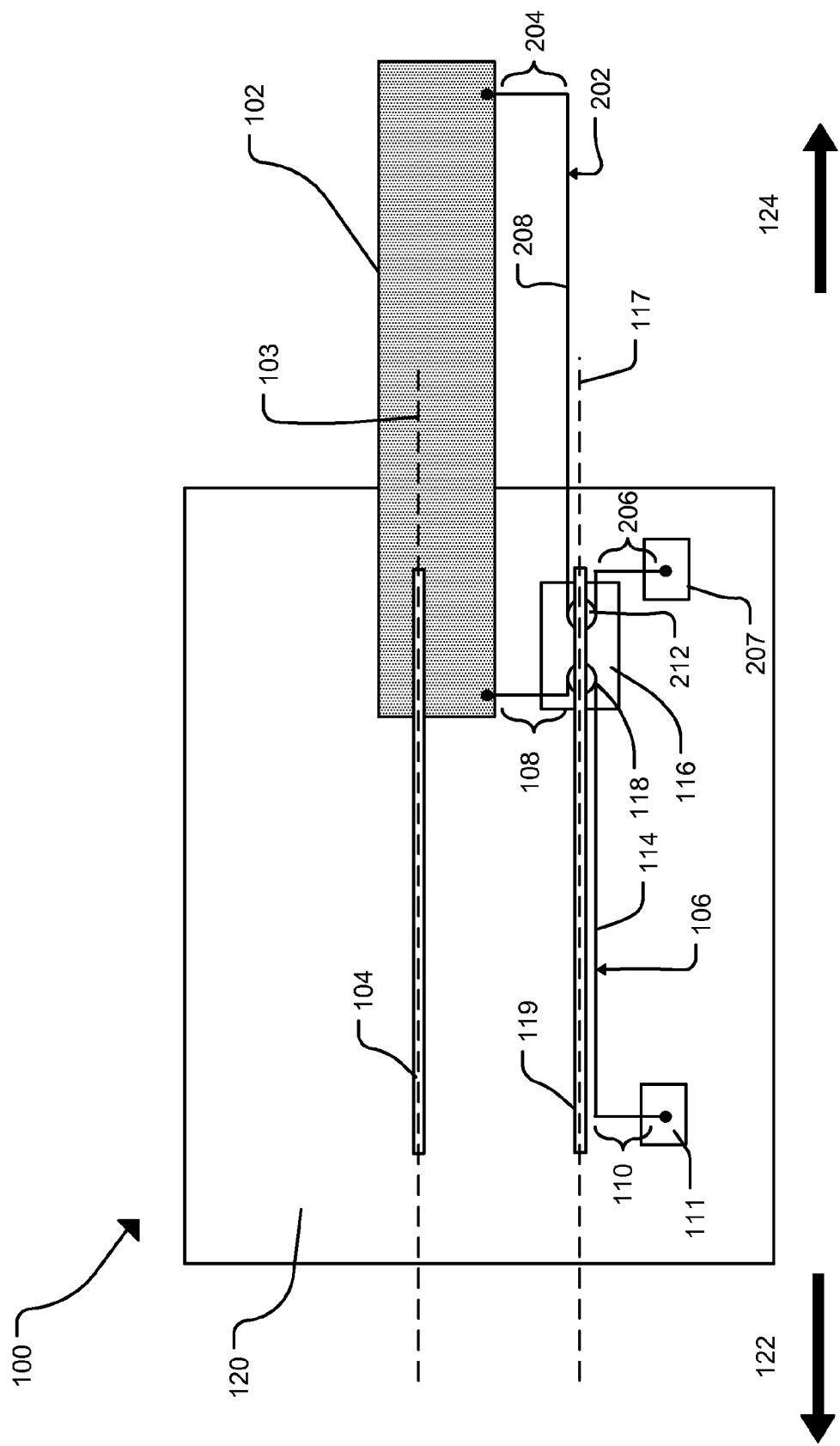
FIG. 3 is diagram of an embodiment of a grounded belt and drawer apparatus showing a drawer and a first belt and second belt positioned in an open position.

The drawer 102 may be moveable on the first track 104 between a closed position, as seen in FIG. 2, and an open position, as seen in FIG. 3. The first track 104 may allow the drawer 102 to slideably move between the open position and the closed position. Referring again to FIG. 1, the drawer 102 may be connected to a first belt 106, described further below, at a first end 108 of the first belt 106. The drawer 102 may be grounded, in the open position, closed position, and between through a conductive path beginning at the first end 108, to the second end 110, and to the first fixed point 111.

The first belt 106 may provide a conductive pathway and the means by which the drawer 102 may be grounded. The first belt 106 may have a first end 108 and a second end 110. The first end 108 may be conductively connected to the drawer 102. The second 108 end may be conductively connected to the first fixed point 111. The first end 108 conductively connected to the drawer 102 and the second end 110 conductively connected to the first fixed point 111 may form a conductive pathway to the first fixed point 111 and may ground the drawer 102 to the first fixed point 111. The first end 108 and the second end 110 may be constructed partially or completely from conductive materials. In various embodiments, the first end 108 and the second end 110 may be substantially perpendicular to the first segment 112 and the second segment 114. In other embodiments, the first end 108 and the second end 110 may have any suitable angle between them. As seen in at least FIG. 4, the first end 108 and the second end 110 may have an angle between them on the order of about 75 degrees. The first belt 102 may be constructed from flexible conductive material. In an embodiment, the first belt 104 may be constructed from materials including copper, steel, aluminum, silver, gold and other conductive material.

Figure 4:
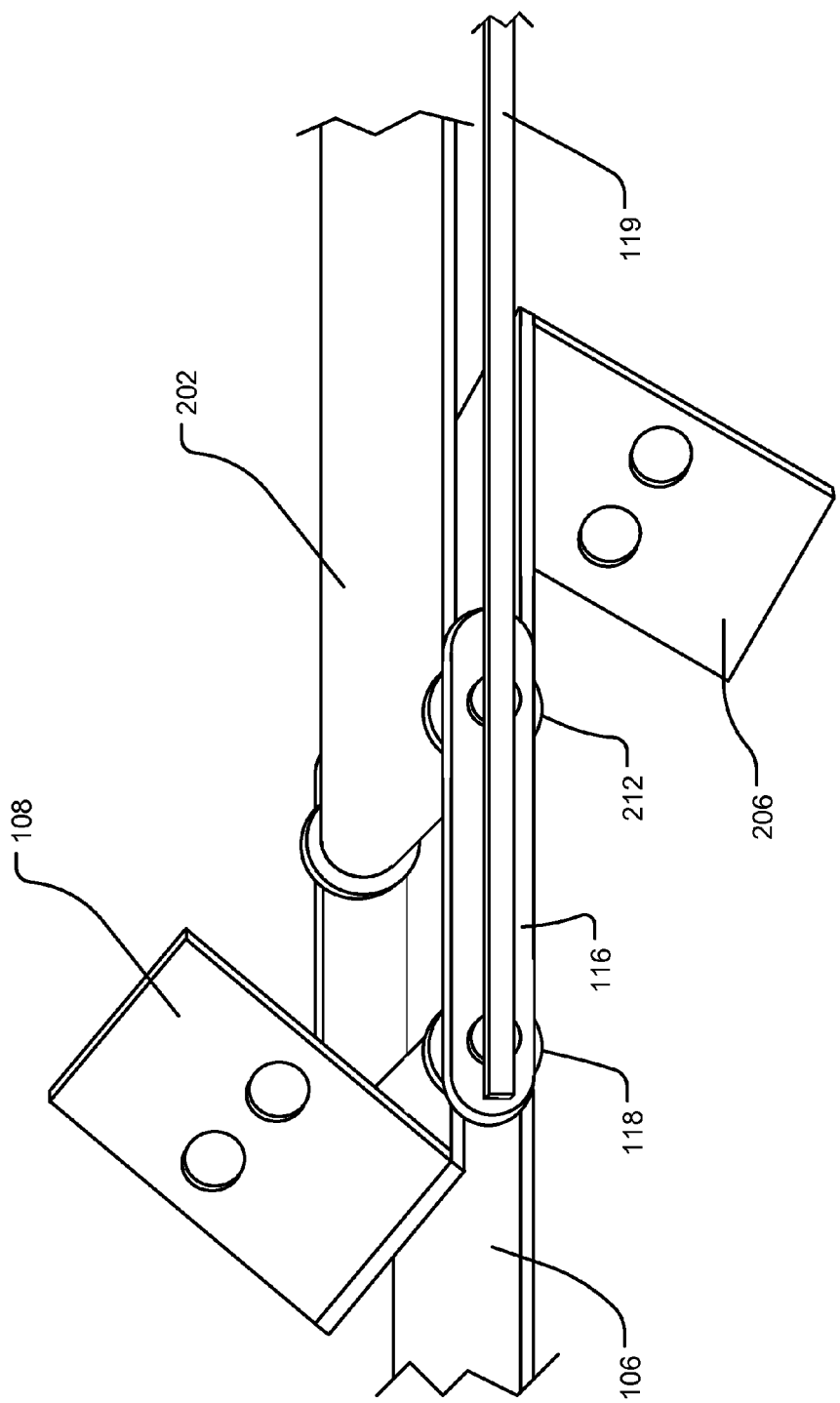
FIG. 4 is diagram of an embodiment of a tensioner body showing a first and second pulley and a first belt and second belt rounded over the first and second pulleys.

Referring to FIGS. 1 and 4, the first belt 106 may round over the first pulley 118. By rounding over the first pulley 118 the first belt 106 may have a first segment 112 and a second segment 114 which extend distally from the first pulley 118 and orient the first segment 112 and the second segment 114 in the first direction 122. When the first belt 106 is rounded over the first pulley 118 it may apply force on the tensioner body 116 in the first direction 122 as the drawer 102 operably moves in the first direction 122. The first segment 112 and the second segment 114 may also extend substantially in parallel from the first pulley 118. As the first belt 106 grounds the drawer 102 the first belt 106 may have inductance which may generate voltage in the first belt 106 and other conductors nearby. As discussed below, the first belt 106 may be located within the first track 104. The first segment 112 and second segment 114 extending distally from the first pulley 118 may place two inductances substantially in parallel which may decrease the inductance of the first belt 106. In an embodiment, the first segment 112 and second segment 114 may decrease inductance of the first belt 106 by approximately half. Similarly, first segment 112 and second segment 114 may also have a width which may decrease the inductance generated by the first belt 106. In an embodiment, the first segment 112 and the second segment 114 may have a width approximately equal to 3.8 centimeters.

As shown in FIG. 1, The first segment 112 and the second segment 114 may be positioned in a substantially close overlying relationship when the drawer 102 is in the closed position. In an embodiment, the first segment 108 and the second end 110 may be separated by a distance approximately equal to the diameter of the first pulley 118. In the embodiment, the diameter of the first pulley 118 may be approximately 1 millimeter.

A close overlying relationship between the first segment 112 and the second segment 114 may create a capacitive coupling effect between the first segment 112 and the second segment 114. Capacitive coupling between the first segment 112 and the second segment 114 may allow the drawer 102 to ground via a direct path through the first belt 106 and across the gap between the first segment 112 and the second segment 114. In an embodiment, the first segment 112 and the second segment 114 are separated by a distance of approximately 1 millimeter, which may allow for capacitive coupling to occur across the first segment 112 and the second segment 114. The first belt 106 may be at least partially covered in flexible non-conductive material. In an embodiment, the flexible non-conductive material may be made from kapton. In an embodiment, the first belt 106 may be entirely covered by flexible non-conductive material. In another embodiment, the first belt 106 may be covered at least on the surface of the first belt 106 which contacts the first pulley 118.

In FIG. 1, an embodiment can be seen having a first pulley 118 attached to a tensioner body 116. The first pulley 118 may have a substantially cylindrical shape which may allow the first belt 106 to slidably round over the first pulley 118. The first pulley 118 may be rotatable on the tensioner body 116 which may reduce friction of the first belt 106 as it contacts the first pulley 118 as the drawer 102 moves between the open and closed positions. As previously discussed, the first pulley 118 may separate the first segment 112 and the second segment 114 by a distance approximately equal to the diameter of the first pulley 118. In an embodiment, the diameter of the first pulley 118 may be approximately 1 millimeter.

The tensioner body 116 may provide a body which, when combined with the supporting member 115 and the first pulley 118, may maintain tautness in the first belt 106 as the drawer 102 moves between the open position and the closed position. By remaining taut between the open position and closed position, the first belt 106 may decrease the likelihood that the first segment 112 and the second segment 114 become in contact and create additional electrostatic noise or charges.

The tensioner body 116 may be mounted on a second track 119. The tensioner body 116 may be moveable on the second reference line 117 in at least in the first direction 122 and the second direction 124. The second track 119 and the second reference line 117 may be parallel to the first track 104. The second track 119 may be positioned at least partially enclosed within the first track 104 so that the first belt 106 and the tensioner body 116 are also located at least partially enclosed within the first track. As discussed above, the tensioner body 116 may have the first pulley 118 attached, however it is contemplated that multiple pulleys, or other elements may also be attached to the tensioner body 116. In FIG. 2, an embodiment, which is discussed further below, can be seen having a first pulley 118 and a second pulley 212 with a second belt 202 rounded over the second pulley 212.

The supporting member 115 may be attached to the tensioner body 116 and to the drawer 102. The supporting member 115 may apply force on the tensioner body 116 in the second direction 124 as the drawer 102 operably moves in the second direction 124. The force on the tensioner body 116 in the second direction 124 may maintain tautness of the first belt 106 as the drawer 102 is moved between the open position and closed position. In an embodiment, the supporting member 115 may be a spring. In another embodiment the supporting member 115 may be a cable and a pulley. The cable and pulley may be, but is not limited to being a gun tackle, luff tackle, double tack, gyn tack, threefold tackle, or other type of cable and pulley system.

The chassis 120 may provide a body in which one or more of the drawer 102, the tensioner body 116, the first track 104, and the second track 119 may be mounted. The chassis 120 may at least partially enclose one or more of the drawer 102, the tensioner body 116, the first belt 106, and the first fixed point 111. The chassis 120 may be constructed from various materials which may allow one or more of the drawer 102, the tensioner body 116, the first track 104, and the second track 119 to be mounted within. These materials may include conductive materials so that the drawer 102 may be conductively grounded to the chassis 120. Referring to FIGS. 2 and 3, In an embodiment, the first fixed point 111 and the second fixed point 207 are points within the chassis 120 such that the drawer 102 is grounded to the chassis 120. The chassis 120 may also at least partially enclose the second belt 202, discussed further below, and the second fixed point 207.

Referring now to FIGS. 1, 2, 3, and 4 the supporting member 115 may also be a second belt 202, having a first end 204, a second end 206, a first segment, 208, and a second segment 210. The second belt 202 may be generally constructed in the same manner and from the same materials as the first belt 106. The second belt 202 may provide a conductive pathway and the means by which the drawer 102 may be grounded. The second belt 202 may have a first end 204 and a second end 206. The first end 204 may be conductively connected to the drawer 102. The second end 206 may be conductively connected to the second fixed point 207. The first end 204 conductively connected to the drawer 102 and the second end 206 conductively connected to the second fixed point 207 may form a conductive pathway from the drawer 102 to the second fixed point 207. The first end 204 and the second end 206 may be constructed partially or completely from conductive materials. The first end 204 and the second end 206 may be substantially perpendicular to the first segment 208 and the second segment 210.

Referring now to FIGS. 2, 3, and 4, the second belt 202 may round over the second pulley 212. By rounding over the second pulley 212 the second belt 202 may have a first segment 208 and a second segment 210 which extend distally from the second pulley 212 and orient the first segment 208 and the second segment 210 in the second direction 124. When the second belt 202 is rounded over the second pulley 212 it may apply force on the tensioner body 116 in the second direction 124 as the drawer 102 operably moves in the second direction 124. The first segment 208 and the second segment 210 may extend distally from the second pulley 212 substantially in parallel. As the second belt 202 is rounded over the second pulley 212 the second belt 202 may be located at least partially enclosed within the first track 104. As the second belt 202 grounds the drawer 102, the second belt 202 may have an inductance which may generate voltage in the second belt 202 and other conductors nearby.

The first segment 208 and the second segment 210 of the second belt 202 extending distally from the second pulley 212 substantially in parallel may decrease the total inductance of the second belt 202. In an embodiment, the first segment 208 and the second segment 210 substantially in parallel decrease the inductance of the second belt 202 by approximately half. Similarly, the substantially in parallel portions of the second belt 202 may also have a width which may also decrease the inductance generated by the second belt 202. In an embodiment, the second belt 202 may have a width approximately equal to 3.8 centimeters.

The first segment 208 and the second segment 210 may be positioned in a substantially close overlying relationship when the drawer 102 is in the closed position. The first segment 208 and the second segment 210 may also be separated by a distance approximately equal to the diameter of the second pulley 212. In an embodiment, the diameter of the second pulley 212 may be approximately 1 millimeter.

A close overlying relationship between the first segment 208 and the second segment 210 may create a capacitive coupling effect between the first segment 208 and the second segment 210. Capacitive coupling between the first end 208 and the second end 210 may allow the drawer 102 to ground via a conductive path through the second belt 202 and across the gap between the first segment 208 and the second segment 210. In an embodiment, the first segment 208 and the second segment 210 are separated by a distance of approximately 1 millimeter. The second belt 202 may be at least partially covered in flexible non-conductive material. In an embodiment, the flexible non-conductive material may be made from kapton. In an embodiment, the second belt 202 may be entirely covered by flexible non-conductive material. In another embodiment, the second belt 202 may be covered at least on the surface of the second belt 202 which is in contact with the second pulley 212.

Figure 5:
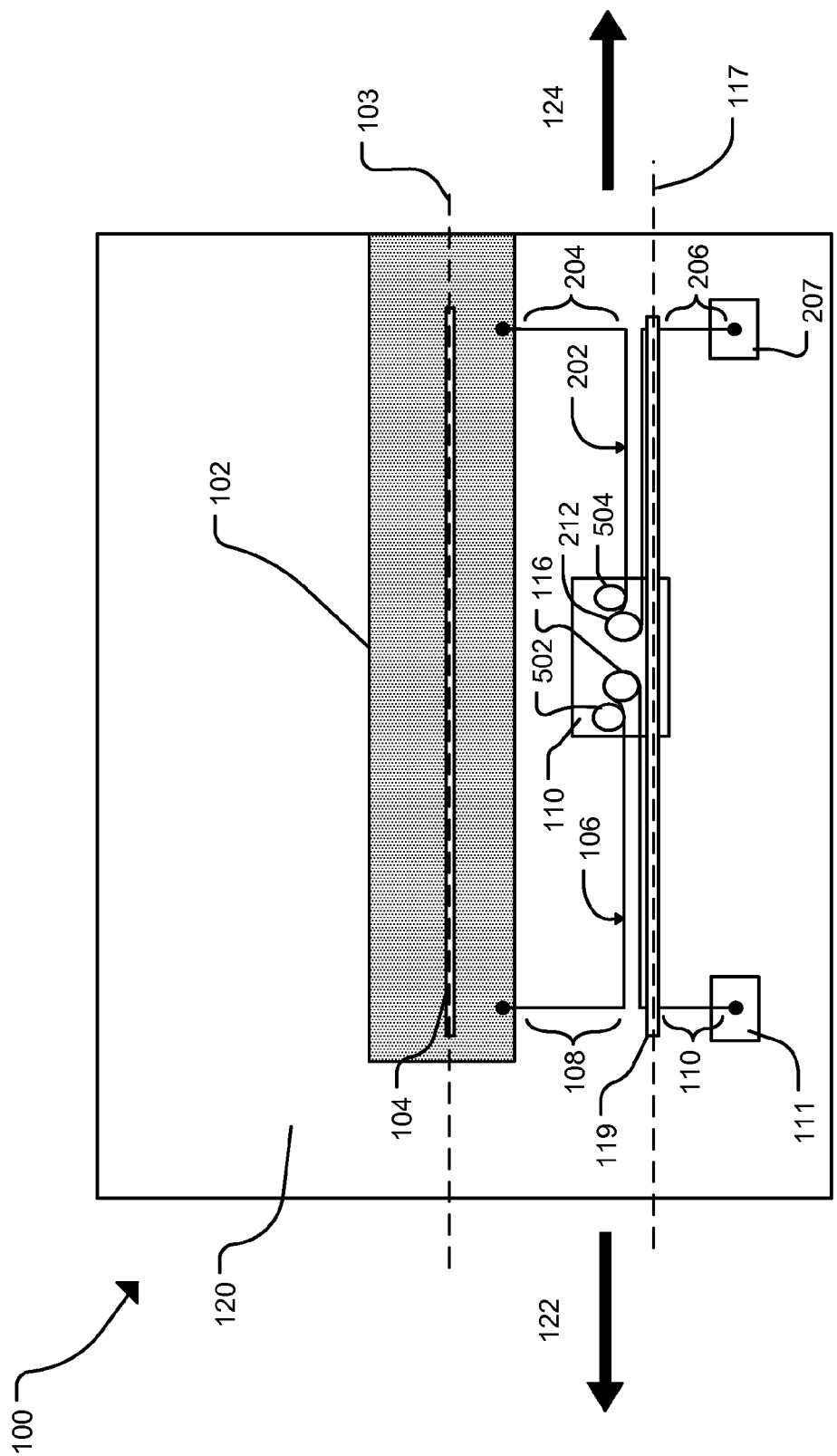
FIG. 5 is diagram of an embodiment of a grounded belt and drawer apparatus showing a drawer and a first belt and second belt with a first and second deflection pulleys.

Referring now to FIG. 5, the tensioner body 116 may also have a first deflection pulley 502 and a second deflection pulley 504. The first deflection pulley 502 and the second deflection pulley 504 may deflect the first segment 112 and the second segment 114 of first belt 106 into a substantially close overlying position and the first segment 208 and the second segment 210 of the second belt 202 into a substantially close overlying position. This may increase the capacitive coupling as the first segment 112 and the second segment 114 of the first belt 106 and first segment 208 and the second segment 210 of the second belt 202 are deflected together. In an embodiment, the first deflection pulley 502 and the second deflection pulley 504 may deflect the segments of the first belt 106 and the second belt 202 to a distance apart of approximately equal to half of the diameter of the first pulley 118 and the second pulley 212. In an embodiment, the first deflection pulley 502 and second deflection pulley 504 may deflect the first belt 106 and the second belt 202 to a distance apart of approximately 0.5 millimeters.

The foregoing description of exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather determined in view of what would be apparent to those skilled in the art from the description provided herein and the claims appended hereto.

We claim:

1. A grounded belt and drawer apparatus comprising:
    a drawer, mounted on a first track, the drawer moveable on a first line in a first direction and a second direction, the first and second directions being opposite;
    a tensioner body having a first pulley, the tensioner body mounted on a second track, the tensioner body moveable on a second line in the first direction and the second direction and parallel to the first line;
    a first belt constructed from flexible conductive material and having a first end and a second end, the first belt rounding over the first pulley and having a first segment and a second segment extending distally from the first pulley in the first direction, the first end conductively connected to the drawer and the second end conductively connected to a first fixed point; and
    a supporting member, attached to the tensioner body and to the drawer, the supporting member applying force on the tensioner body in the second direction as the drawer operably moves in the second direction;
    wherein the first belt forms a conductive path from the drawer to the first fixed point.

2. The grounded belt and drawer apparatus according to claim 1, wherein the drawer is moveable between a closed position and an open position, the first segment and the second segment positioned in a substantially close overlying relationship when the drawer is in the closed position.

3. The grounded belt and drawer apparatus according to claim 1, wherein the second track is positioned at least partially enclosed in the first track.

4. The grounded belt and drawer apparatus according to claim 1, wherein the first segment and the second segment extend distally from the first pulley substantially in parallel.

5. The grounded belt and drawer apparatus according to claim 4, further comprising a first deflection pulley, connected to the tensioner body, the first deflection pulley deflecting the first segment into a substantially close overlying relationship with the second segment.

6. The grounded belt and drawer apparatus according to claim 1, wherein the first belt is at least partially covered in flexible non-conductive material.

7. The grounded belt and drawer apparatus according to claim 1, wherein the supporting member includes a spring.

8. The grounded belt and drawer apparatus according to claim 1, wherein the supporting member includes a cable and a pulley.

9. The grounded belt and drawer apparatus according to claim 1, further comprising a chassis, the chassis at least partially enclosing the drawer.

10. The grounded belt and drawer apparatus according to claim 9, wherein the second end is conductively connected to the chassis and forms a conductive pathway from the drawer to the chassis.

11. The grounded belt and drawer apparatus according to claim 1, wherein the flexible conductive material is one or more selected from the group including, copper, steel aluminum, silver, and gold.

12. A grounded belt and drawer apparatus comprising:
    a drawer, mounted on a first track, the drawer moveable on a first line in a first direction and a second direction, the first and second directions being opposite;
    a tensioner body having a first pulley and a second pulley, the tensioner body mounted on a second track, the tensioner body moveable in the first direction and the second direction and parallel to the first line;
    a first belt constructed from flexible conductive material and having a first end and a second end, the first belt rounding over the first pulley and having a first segment and a second segment extending distally from the first pulley in the first direction, the first end conductively connected to the drawer and the second end conductively connected to a first fixed point; and
    a second belt constructed from flexible conductive material and having a first end and a second end, the second belt rounding over the second pulley and having a first segment and a second segment extending distally from the second pulley in the second direction, the first end conductively connected to the drawer and the second end conductively connected to a second fixed point; and
    wherein the first belt forms a conductive pathway from the drawer to the first fixed point and the second belt forms a conductive pathway from the drawer to the second fixed point.

13. The grounded belt and drawer apparatus according to claim 12, wherein the drawer is moveable between a closed position and an open position, the first segment and the second segment of the first belt is positioned in a substantially close overlying relationship when the drawer is in the closed position, and the first segment and the second segment of the second belt is positioned in a substantially close overlying relationship when the drawer is in the closed position.

14. The grounded belt and drawer apparatus according to claim 12, wherein the second track is positioned at least partially enclosed in the first track.

15. The grounded belt and drawer apparatus according to claim 12, wherein the first segment and the second segment of the first belt extend distally from the first pulley substantially in parallel and the first segment and the second segment of the second belt extend distally from the second pulley substantially in parallel.

16. The grounded belt and drawer apparatus according to claim 15, further comprising a first deflection pulley and a second deflection pulley, the first and second deflection pulleys connected to the tensioner body, the first deflection pulley deflecting the first segment and the second segment of the first belt into a substantially close overlying relationship and the second deflection pulley deflecting the first segment and the second segment of the second belt into a substantially close overlying relationship.

17. The grounded belt and drawer apparatus according to claim 12, wherein the first belt and the second belt are at least partially covered in flexible non-conductive material.

18. The grounded belt and drawer apparatus according to claim 12, further comprising a chassis, the chassis at least enclosing the drawer.

19. The grounded belt and drawer apparatus according to claim 18, wherein the second end of the first belt and the second belt are conductively connected to the chassis and form a conductive path from the drawer to the chassis.

20. The grounded belt and drawer apparatus according to claim 12, wherein the flexible conductive material is one or more selected from the group including, copper, steel aluminum, silver, and gold.

\* \* \* \* \*